(12) United States Patent
Pang et al.

(10) Patent No.: US 11,373,968 B2
(45) Date of Patent: Jun. 28, 2022

(54) VIA STRUCTURE FOR SEMICONDUCTOR DIES

(71) Applicant: Cirrus Logic International Semiconductor Ltd., Edinburgh (GB)

(72) Inventors: Yaoyu Pang, Austin, TX (US); Steven A. Atherton, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/857,606

(22) Filed: Apr. 24, 2020

(65) Prior Publication Data

US 2020/0343206 A1 Oct. 29, 2020

Related U.S. Application Data

(60) Provisional application No. 62/839,066, filed on Apr. 26, 2019.

(51) Int. Cl.
*H01L 23/00* (2006.01)
*H01L 23/52* (2006.01)

(52) U.S. Cl.
CPC .............. *H01L 24/05* (2013.01); *H01L 24/03* (2013.01); *H01L 2224/03011* (2013.01); *H01L 2224/0401* (2013.01); *H01L 2224/05541* (2013.01); *H01L 2224/05559* (2013.01); *H01L 2224/05569* (2013.01); *H01L 2224/05572* (2013.01)

(58) Field of Classification Search
CPC .............. H01L 2224/0401; H01L 2224/05541
See application file for complete search history.

(56) References Cited

U.S. PATENT DOCUMENTS

| 7,952,206 B2 * | 5/2011 | Bachman ................. H01L 24/05 257/778 |
| 7,977,789 B2 | 7/2011 | Park |
| 9,793,243 B2 | 10/2017 | Lu et al. |
| 2007/0023920 A1* | 2/2007 | Jao ......................... H01L 23/367 257/E23.102 |
| 2013/0087910 A1* | 4/2013 | Abdul Razak .......... H01L 24/16 257/737 |

\* cited by examiner

*Primary Examiner* — Dale E Page
*Assistant Examiner* — Wilner Jean Baptiste
(74) *Attorney, Agent, or Firm* — Jackson Walker L.L.P.

(57) ABSTRACT

A semiconductor die may be coupled to a printed circuit board using a solder ball. The semiconductor die comprises a redistribution layer formed above a semiconductor chip, a polymer layer formed on the redistribution layer, and an Under Bump Metallurgy (UBM) layer formed on the polymer layer. The polymer layer comprises a plurality of vias, which electrically couple the UBM layer to the redistribution layer. The entire UBM layer may be deposited with a continuously flat upper surface for coupling to the solder ball. The plurality of vias may be positioned such that they are centered on a point that is not central to the UBM layer.

2 Claims, 7 Drawing Sheets

VIA STRUCTURE FOR SEMICONDUCTOR DIES

TECHNICAL FIELD

The present disclosure describes semiconductor dies suitable for coupling to a printed circuit board using a solder ball, and to methods of manufacture thereof. More specifically, the disclosure relates to a via structure for the semiconductor dies.

RELATED APPLICATIONS

The present disclosure claims priority to U.S. Patent Application Ser. No. 62/839,066 filed Apr. 26, 2019, which is incorporated by reference herein in its entirety.

BACKGROUND

Ball Grid Array (BGA) packages of semiconductor devices have become increasingly popular. In a Ball Grid Array, a grid array of solder balls is applied to a printed circuit board, and an integrated circuit can be mounted to the printed circuit board by means of the solder balls. A solder ball of a BGA is stressed through excessive temperature cycling (TC) due to a mismatch between material properties, such as the Coefficients of Thermal Expansion (CTE) of the silicon in the integrated circuit die and the printed circuit board substrate to which the solder ball is connected.

The following table gives typical values for the Young's modulus, for the Coefficient of Thermal Expansion (CTE), and for the Poisson's ratio, for silicon and for a printed circuit board (PCB).

|  | Young's Modulus (GPa) | CTE (ppm/° C.) | Poisson's Ratio |
| --- | --- | --- | --- |
| Silicon (Si) | 131 | 2.8 | 0.28 |
| PCB | 27 | 15 | 0.28 |

The difference in material properties causes the materials to react differently under temperature cycling, which places stress on the solder ball connecting the two materials. As a result of this stress, a prevalent failure mode on board level packages is an electronic failure, caused by cracking in the vicinity of a solder ball. For example, the temperature cycling may result in cracking in the bulk of a solder ball, or may cause delamination of one or more layer (for example a Back End of Line (BEOL) layer) within the integrated circuit.

The issue of reliability is made more relevant by the desire for a higher BGA pin count and smaller solder balls, and smaller gaps between solder balls.

SUMMARY

According to some embodiments there is provided a semiconductor die for coupling to a printed circuit board using a solder ball. The semiconductor die comprises a redistribution layer formed above a semiconductor chip. The semiconductor die also comprises a polymer layer formed on the redistribution layer, wherein the polymer layer comprises a plurality of vias. The semiconductor die also comprises an Under Bump Metallurgy (UBM) layer formed on the polymer layer, wherein the plurality of vias electrically couple the UBM layer to the redistribution layer, and wherein the entire UBM layer is deposited with a continuously flat upper surface for coupling to the solder ball.

The plurality of vias may be positioned such that they are centered on a point not central to the UBM layer.

According to some embodiments there is provided a method of manufacturing a semiconductor die. The method comprises forming a polymer layer on a redistribution layer of a semiconductor die, and drilling the polymer layer to provide a plurality of vias through the polymer layer to the redistribution layer. The method further comprises depositing an Under Bump Metallurgy (UBM) layer onto the polymer layer such that the plurality of vias electrically couple the UBM layer to the redistribution layer, and the entire UBM layer is deposited with a continuously flat upper surface for coupling to the solder ball.

According to some embodiments there is provided a semiconductor die for coupling to a printed circuit board using a solder ball. The semiconductor die comprises a redistribution layer formed above a semiconductor chip, and a polymer layer formed on the redistribution layer. The polymer layer comprises a plurality of vias. The semiconductor die further comprises an Under Bump Metallurgy (UBM) layer formed on the polymer layer. The plurality of vias electrically couple the UBM layer to the redistribution layer, and the plurality of vias are positioned such that the plurality of vias are centered on a point not central to the UBM layer.

The UBM layer may be an entire UBM layer deposited with a continuously flat upper surface for coupling to the solder ball.

According to some embodiments there is provided a method of manufacturing a semiconductor die. The method comprises forming a polymer layer on a redistribution layer of a semiconductor die, and drilling the polymer layer to provide a plurality of vias through the polymer layer to the redistribution layer such that the plurality of vias are centered on a point not central to the UBM layer. The method further comprises depositing an Under Bump Metallurgy (UBM) layer on to the polymer layer such that the plurality of vias electrically couple the UBM layer to the redistribution layer.

BRIEF DESCRIPTION OF THE DRAWINGS

For a better understanding of the embodiments of the present disclosure, and to show how it may be put into effect, reference will now be made, by way of example only, to the accompanying drawings, in which.

DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

The present disclosure relates to a semiconductor device, and in particular to a semiconductor device that is intended to be mounted to a printed circuit board, as part of an electronic device such as a laptop or tablet computer, a smartphone, a camera, a smart speaker, a games controller, or indeed any suitable device.

Figure 1:
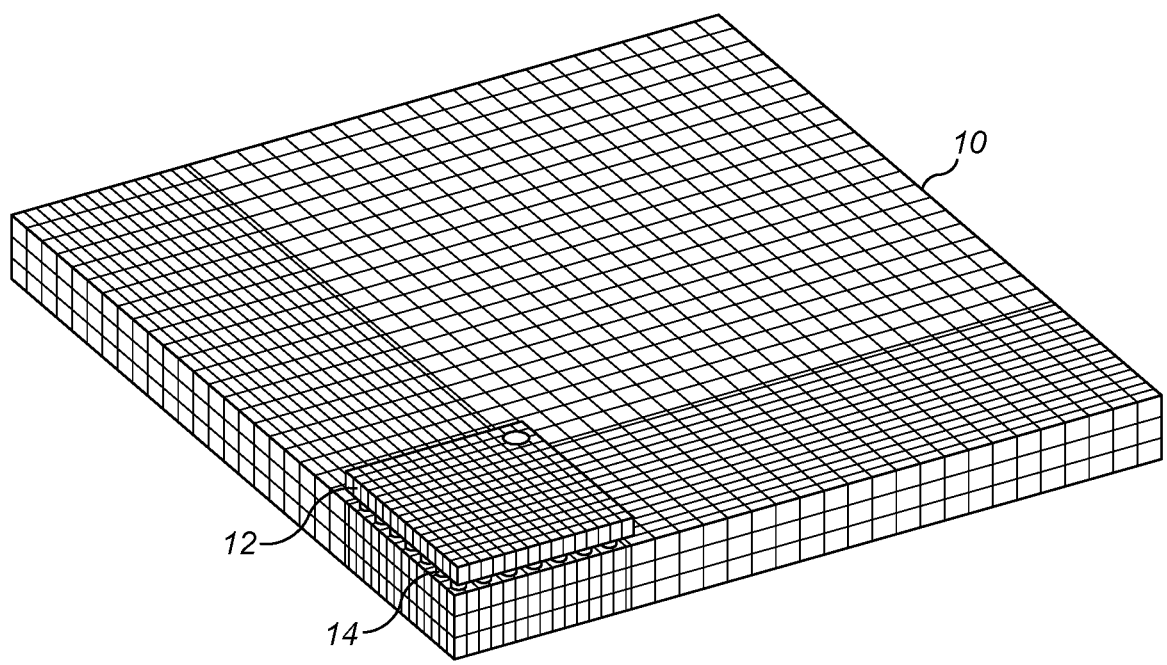
FIG. 1 illustrates an example printed circuit board, with a mounted integrated circuit.

FIG. 1 illustrates an example printed circuit board (PCB) 10. In practice, in a typical device, multiple integrated circuit circuits are mounted to a PCB, but, by way of illustration, FIG. 1 shows an example single integrated circuit 12 mounted on the PCB 10.

The integrated circuit die is coupled to the PCB 10 using an example ball grid array of solder balls 14.

Figure 2:
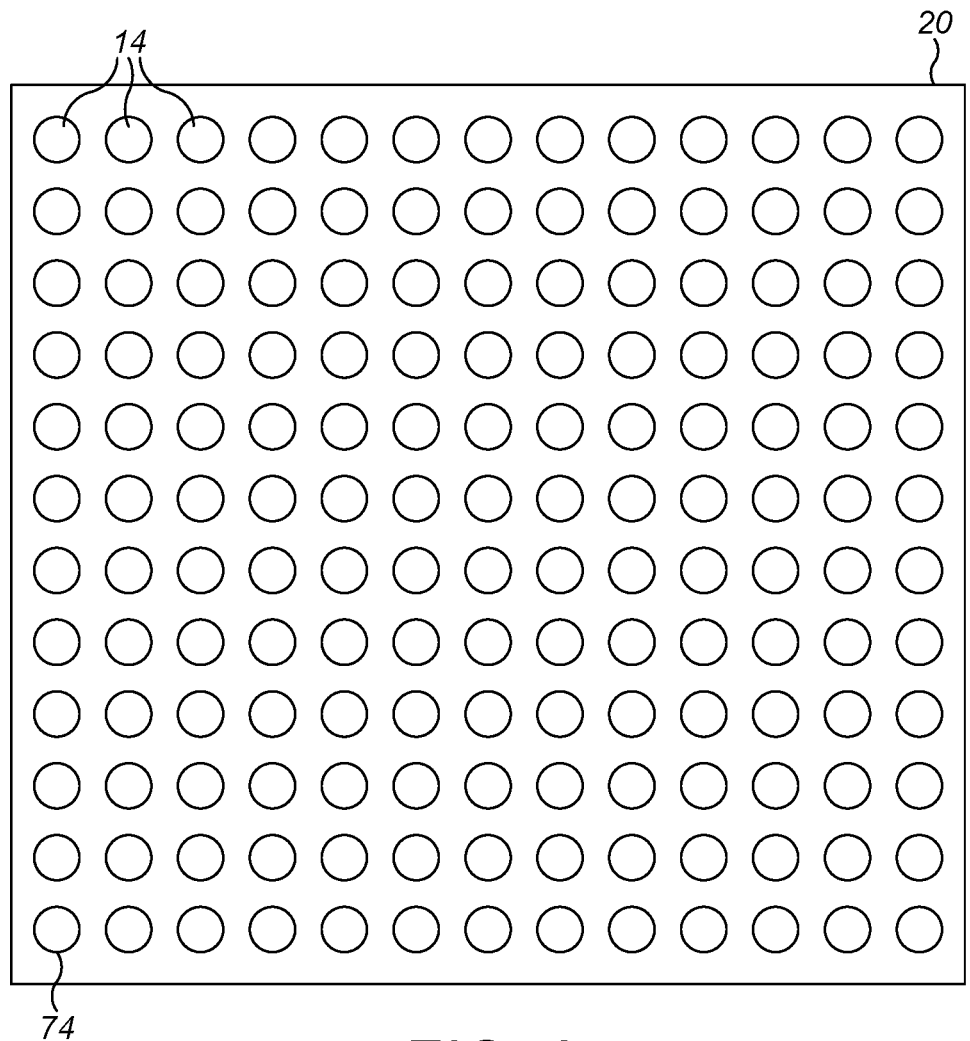
FIG. 2 illustrates an example ball grid array.

FIG. 2 illustrates in more detail the form of the ball grid array (BGA).

FIG. 2 shows an example surface of the semiconductor die 20, in which the integrated circuit 12 is formed. More specifically, FIG. 2 shows the surface of the semiconductor die 20 that is the underside when the integrated circuit 12 that is formed on the semiconductor die 20 is mounted on the PCB 10, as shown in FIG. 1. Examples are described herein in which the semiconductor material used to make the semiconductor die 20 is silicon, but the methods and devices described herein can be used with any suitable semiconductor material.

FIG. 2 illustrates an arrangement of solder balls 14. In this arrangement, the solder balls 14 form a regular grid over the whole of the surface of the semiconductor die 20, but it will be appreciated that this arrangement need not be the case. Further, while FIG. 2 is provided by way of illustration, a ball grid array may contain any required number of solder balls 14.

As discussed above, the material used to make the printed circuit board and the semiconductor material have different material properties, and in particular have different coefficients of thermal expansion. One effect of this material difference is that, as the device is heated (for example by heat generated while the device is in operation) and cooled, the printed circuit board 10 and the semiconductor die 20 expand and contract by different amounts. The result of this differing amount is that the solder balls 14 of the ball grid array are subjected to stresses.

In general terms, solder balls near the corners of the ball grid array are typically under more stress than solder balls near the center of the ball grid array during temperature cycling (TC). This stress can eventually result in fatigue cracking.

Figure 3:
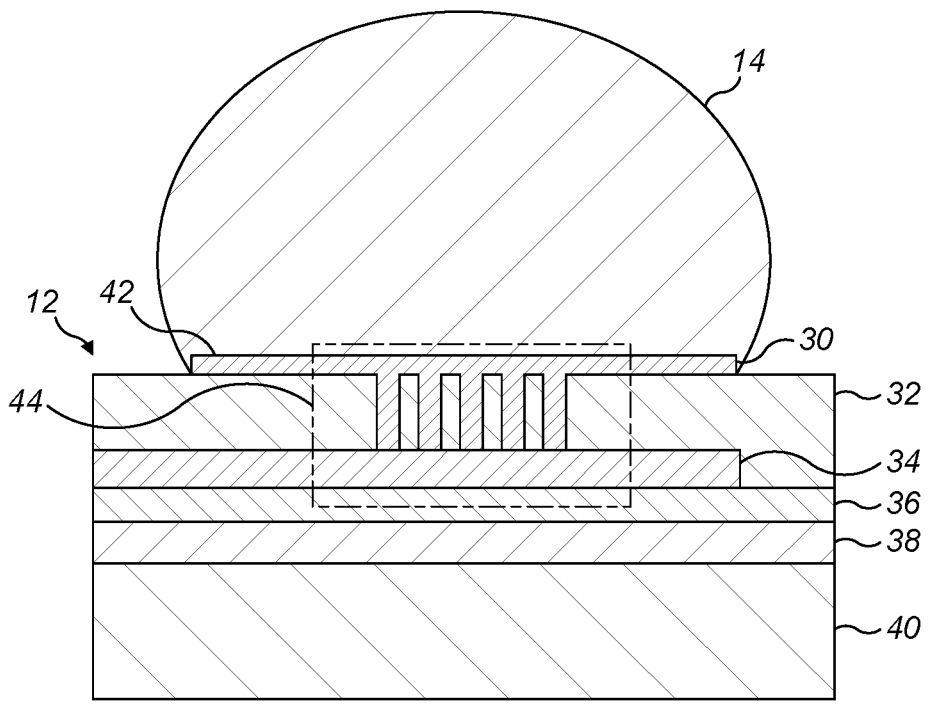
FIG. 3 is a cross-section through an example semiconductor device and solder ball, in one embodiment.

FIG. 3 is a cross-section through an example semiconductor device and one solder ball of the ball grid array, in one embodiment. Specifically, FIG. 3 shows the semiconductor die 12 with a solder ball 14, so this arrangement is inverted from the arrangement shown in FIG. 1. In this orientation, the printed circuit board, which is not shown in FIG. 3, would be on top of the solder balls, including the solder ball 14.

The semiconductor die 12 comprises an Under Bump Metallurgy (UBM) layer 30, a PBO2 polymer layer 32, a redistribution layer (RDL) 34, a PBO1 polymer layer 36, and a Back End of Line (BEOL) stack-up portion 38, formed on the semiconductor (e.g. silicon) substrate 40.

It will be appreciated that the semiconductor die 12 will typically be connected to the printed circuit board by means of many such solder balls 14, and that the structure shown in FIG. 3 may be provided under each of those solder balls.

It will be noted that the UBM layer 30 is formed with a substantially continuously flat upper surface 42 for coupling to the solder ball 14.

A plurality of vias, for example made of copper, are formed through the polymer layer 32, in order to connect the UBM layer 30 to the RDL 34.

Figure 4:
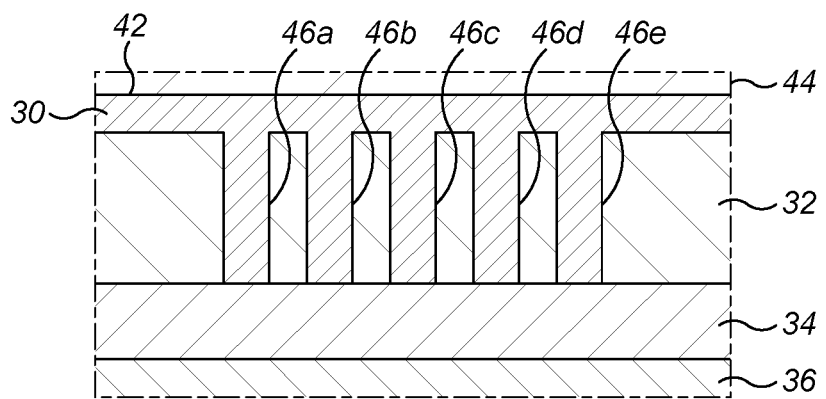
FIG. 4 illustrates in more detail a part of the example semiconductor device of FIG. 3.

FIG. 3 shows a dashed box 44, and FIG. 4 is an enlargement of the box 44. Thus, FIG. 4 shows the UBM layer 30, with its flat upper surface 42, the PBO2 polymer layer 32, the redistribution layer (RDL) 34, and a part of the PBO1 polymer layer 36.

A plurality of vias 46a, 46b, 46c, 46d, 46e are formed through the polymer layer 32, and connect the UBM layer 30 to the RDL 34.

By way of example, in one illustrative embodiment, the UBM layer 30 has a thickness of 5.6 μm, and the vias 46a, 46b, 46c, 46d, 46e have a height of 9 μm and a width of 10 μm.

In another illustrative embodiment, the UBM layer 30 has a thickness of 1 μm, and the vias 46a, 46b, 46c, 46d, 46e have a height of 9 μm and a width of 10 μm.

In another illustrative embodiment, the UBM layer 30 has a thickness of 1 μm, and the vias 46a, 46b, 46c, 46d, 46e have a height of 12 μm and a width of 10 μm.

A method of manufacturing the semiconductor die illustrated in FIGS. 3 and 4 may comprise: forming a polymer layer 32 on a redistribution layer 34 of a semiconductor die 12, drilling the polymer layer 32 to provide a plurality of vias 46a, 46b, 46c, 46d, 46e through the polymer layer 32 to the redistribution layer 34; and depositing an Under Bump Metallurgy (UBM) layer 30 on to the polymer layer 32 such that the plurality of vias 46a, 46b, 46c, 46d, 46e electrically couple the UBM layer 30 to the redistribution layer 34, and the entire UBM layer 30 is deposited with a continuously flat upper surface 42 for coupling to the solder ball 14.

The semiconductor die illustrated in FIGS. 3 and 4 has the advantage that it provides a relatively small effective opening through the stress-relieving PBO2 polymer layer 32, which leads to stress reduction. In addition, it allows a thicker PBO2 layer 32 to be used, which also leads to stress reduction. Further, it allows a thinner UBM pad 30 to be used, which also leads to stress reduction and also allows cost saving.

For example, structures such as that shown in FIGS. 3 and 4 may provide improved life before failure caused by temperature cycling, and may also reduce stress in the Back End of Line (BEOL) portion of the device.

In addition, the depositing of the flat UBM pad also removes any requirement for the etching of the PBO2 layer 32 during manufacture.

FIGS. 3 and 4 show an embodiment in which the vias 46a, 46b, 46c, 46d, 46e are positioned centrally with respect to the UBM layer 30.

In some embodiments, the vias are positioned such that they are centered on a point that is not central to the UBM layer.

Figure 5:
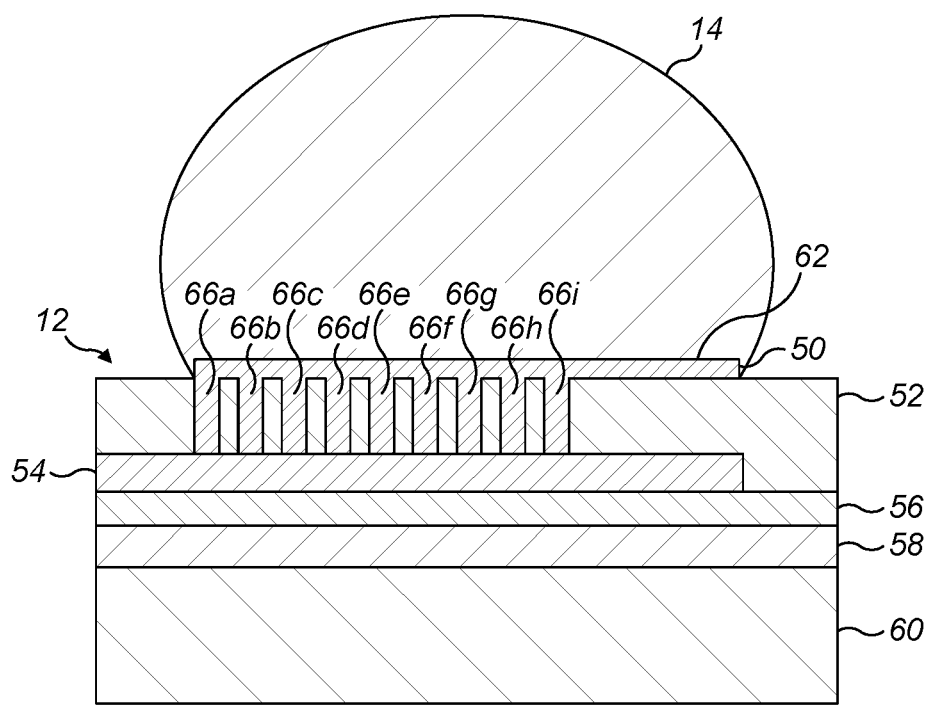
FIG. 5 is a cross-section through an example semiconductor device and solder ball, in another embodiment.

FIG. 5 is a cross-section through an example semiconductor device and solder ball, in such an embodiment.

Similar to the embodiment shown in FIGS. 3 and 4, FIG. 5 shows a semiconductor die 12 with a solder ball 14.

The semiconductor die 12 comprises an Under Bump Metallurgy (UBM) layer 50, a PBO2 polymer layer 52, a redistribution layer (RDL) 54, a PBO1 polymer layer 56, and a Back End of Line (BEOL) stack-up portion 58, formed on the semiconductor (e.g. silicon) substrate 60.

Again, it will be appreciated that the semiconductor die 12 will typically be connected to the printed circuit board by means of many such solder balls 14, and that a structure similar to that shown in FIG. 3 or FIG. 5 may be provided under each of those solder balls.

It will be noted that the UBM layer 50 is formed with a substantially continuously flat upper surface 62 for coupling to the solder ball 14.

A plurality of vias 66a, 66b, 66c, 66d, 66e, 66f, 66g, 66h, 66i, for example made of copper, are formed through the polymer layer 52, and connect the UBM layer 50 to the RDL 54.

A method of manufacturing the semiconductor die illustrated in FIG. 5 may comprise: forming a polymer layer 52 on a redistribution layer 54 of a semiconductor die 12, drilling the polymer layer 52 to provide a plurality of vias 66a, 66b, 66c, 66d, 66e, 66f, 66g, 66h, 66i through the polymer layer 52 to the redistribution layer 54, such that they are centered on a point that is not central to the UBM layer; and depositing an Under Bump Metallurgy (UBM) layer 50 on to the polymer layer 52 such that the plurality of vias 66a, 66b, 66c, 66d, 66e, 66f, 66g, 66h, 66i electrically couple the UBM layer 50 to the redistribution layer 54. In some but not all embodiments of such a method, the UBM layer 50 is deposited with a continuously flat upper surface 62 for coupling to the solder ball 14.

As described with reference to FIG. 3, the semiconductor die illustrated in FIG. 5 has the advantage that it provides effective stress reduction, and hence improved life before failure caused by temperature cycling, and reduced stress in the Back End of Line (BEOL) portion of the device.

In the embodiment shown in FIG. 5, the plurality of vias 66a, 66b, 66c, 66d, 66e, 66f, 66g, 66h, 66i are positioned such that they are centered on a point that is not central to the UBM layer 50.

Although FIG. 5 shows the top surface 62 of the UBM layer 50 being continuously flat, in other embodiments it has a bend or kink. The depositing of the flat UBM pad removes any requirement for the etching of the PBO2 layer 52 during manufacture. However, a non-flat upper surface of the UBM layer, for example with an indentation, may have other advantages.

Figure 6:
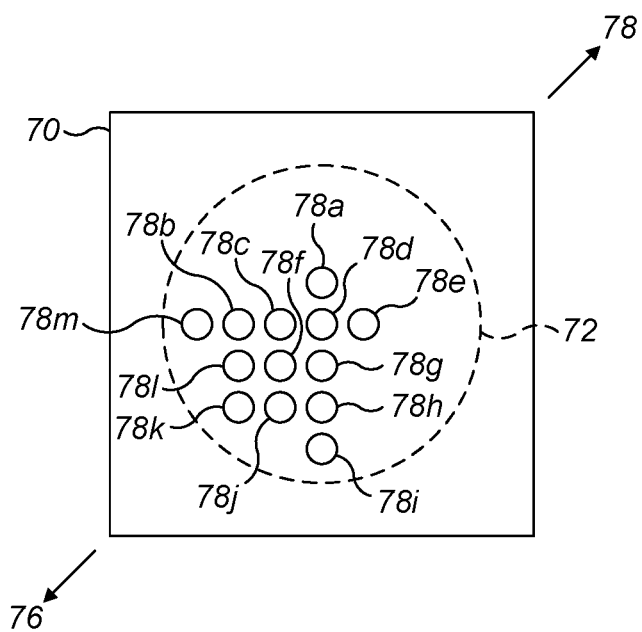
FIG. 6 is an illustration of a plan view of an example semiconductor device, in one embodiment.

FIG. 6 is an illustration of a plan view of a part of an example semiconductor device, in one embodiment.

Specifically, FIG. 6 shows one section of a semiconductor device 70, for example a section that includes a single Under Bump Metallurgy (UBM) region 72, to which one solder ball may be coupled.

It was noted with reference to FIG. 2 that, in general terms, solder balls near the corners of the ball grid array are typically under more stress than solder balls near the center of the ball grid array during temperature cycling (TC).

The vias that extend through the polymer layer in order to electrically couple the UBM layer to the redistribution layer have the effect of reducing that stress and so, in some embodiments, when the plurality of vias are positioned such that they are centered on a point that is not central to the UBM layer, they are positioned such that they are centered at a point that is towards the corner of the ball grid array.

Thus, by way of an illustrative example only, and referring back to FIG. 2, FIG. 6 is showing the section of the semiconductor device to which the solder ball 14 may be coupled. Therefore, the corner of the semiconductor device package is in the direction of the arrow 76, and the center of the semiconductor device package is in the direction of the arrow 78.

The UBM region 72 shown in FIG. 6 is provided with multiple vias 78a, 78b, 78c, 78d, 78e, 78f, 78g, 78h, 78i, 78j, 78k, 78l, 78m, and the vias are positioned such that their center is offset from the center of the UBM region 72, in the direction of the arrow 76, that is towards the corner of the ball grid array.

Because the vias are on average positioned in the region of the semiconductor device that suffers from the highest stress, this positioning has the effect that the stress reduction effect of the vias is maximized.

This principle may be applied to as much of the ball grid array as required.

For example, a non-centered arrangement of vias may be used in connection with the solder balls in some or all of the corners of the ball grid array. As another example, the non-centered arrangement of vias may be used in connection with multiple solder balls in some or all of the corner regions of the ball grid array.

As another example, a non-centered arrangement of vias may be used in connection with one or more solder balls along one or more edge of the ball grid array. In this case, the plurality of vias may be positioned such that they are centered on a point that is not central to the UBM layer, but rather is offset towards the edge of the ball grid array.

Figure 7:
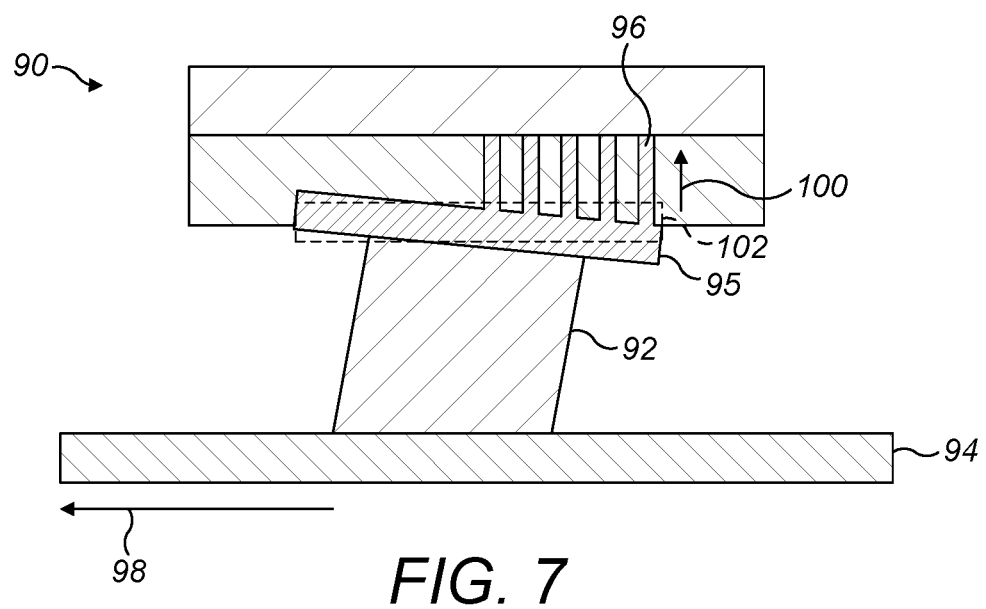
FIG. 7 illustrates the example semiconductor device and solder ball, when connected to a printed circuit board.

FIG. 7 illustrates a part of an example semiconductor device 90 and one of the associated solder balls 92, when connected to a printed circuit board 94, to illustrate the effect of the off-center arrangement of vias.

For ease of illustration, the semiconductor device is not shown in as much detail as in FIGS. 3, 4 and 5, but FIG. 7 does show the UBM layer 95 and the copper vias 96 etc. In this example, the arrow 98 points in the direction of the center of the package.

Specifically, FIG. 7 shows that, because the silicon of the semiconductor device 90 and the material of the printed circuit board 94 have different coefficients of thermal expansion, when the device is heated (either by heat generated during operation of the device or because it is being used in high ambient temperatures), the solder ball 92 may be distorted to absorb the differential expansion. However, the expansion of the vias 96 etc. means that the stress in the solder ball 92 is reduced. This effect is maximized because the vias 96 etc. are located in the region of the UBM layer 95 that is under the highest tension, namely the region that is furthest from the center of the package.

When the device is cooled back to its normal temperature, the vias 96 contract to their normal lengths, as shown by the arrow 100, and the UBM layer returns to its normal position 102, as shown in dashed lines.

FIGS. 8(a), 8(b) and 8(c) are illustrations of plan views of parts of an example semiconductor device, in further embodiments.

FIG. 8(a) shows a part 110 of a semiconductor device that includes one UBM region 112 to which a single solder ball may be coupled. The arrow 114 shows the direction of the center of the package.

There are two vias 116*a*, 116*b* through the UBM region 112. For example, each via may have a width of 10 μm. They are centered on a point that is not central to the UBM region 112, but rather is offset towards the corner of the package.

Figure 8:
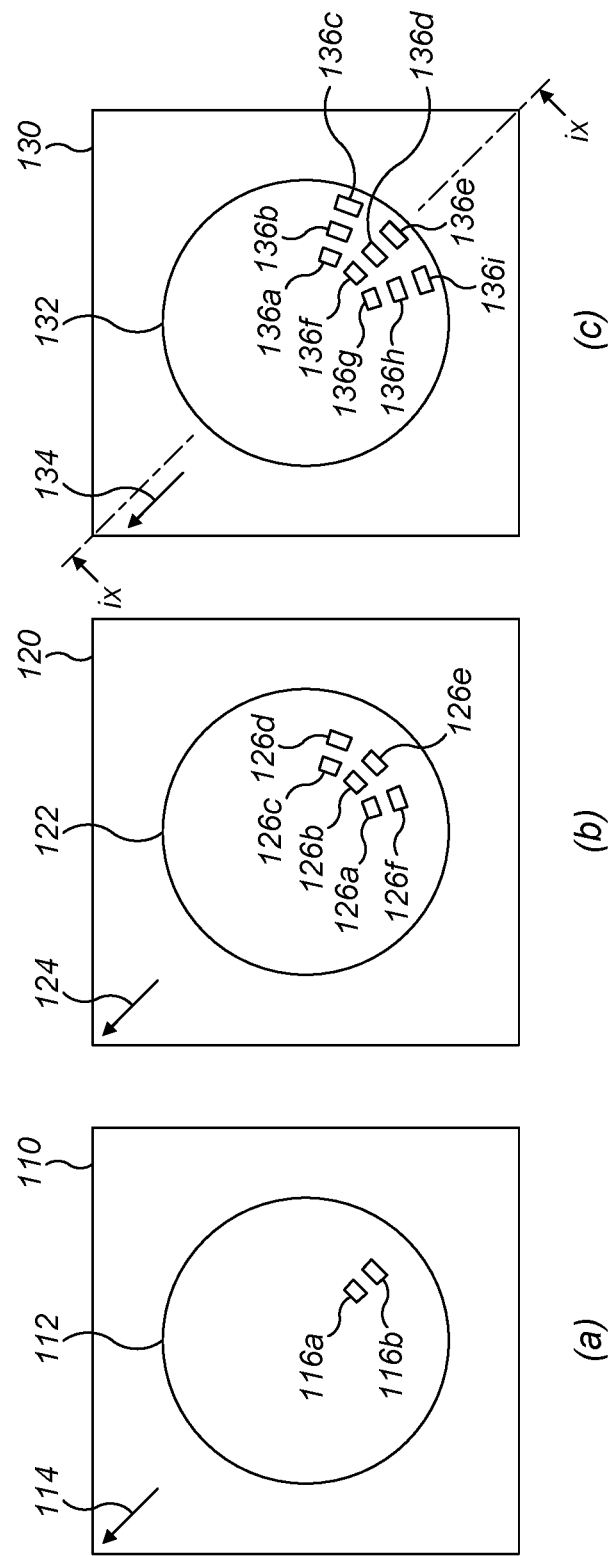
FIGS. 8(a), 8(b) and 8(c) are illustrations of plan views of parts of an example semiconductor device, in further embodiments.

FIG. 8(*b*) shows a part 120 of an example semiconductor device that includes one UBM region 122 to which a single solder ball may be coupled. The arrow 124 shows the direction of the center of the package.

There are six vias 126*a*, 126*b*, 126*c*, 126*d*, 126*e*, 126*f* through the UBM region 122. For example, each via may have a width of 10 μm. They are centered on a point that is not central to the UBM region 122, but rather is offset towards the corner of the package.

FIG. 8(*c*) shows a part 130 of an example semiconductor device that includes one UBM region 132 to which a single solder ball may be coupled. The arrow 134 shows the direction of the center of the package.

There are nine vias 136*a*, 136*b*, 136*c*, 136*d*, 136*e*, 136*f*, 136*g*, 136*h*, 136*i* through the UBM region 132. For example, each via may have a width of 10 μm. They are centered on a point that is not central to the UBM region 132, but rather is offset towards the corner of the package.

Figure 9:
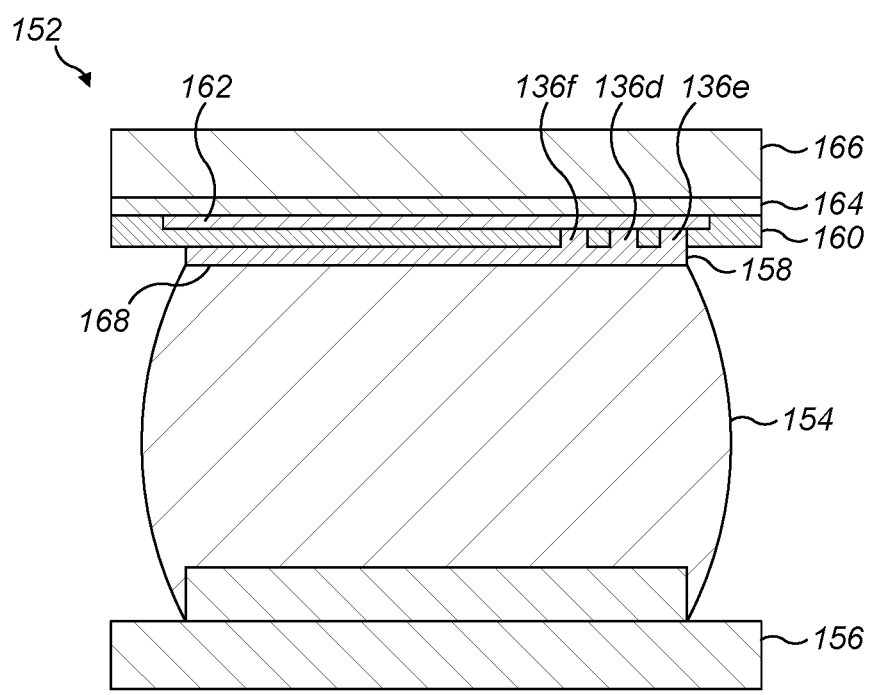
FIG. 9 is a cross-sectional view of the example semiconductor device and solder ball, when connected to a printed circuit board.

FIG. 9 is a cross-sectional view of the semiconductor device shown in FIG. 8(*c*) on the arrows ix-ix, when connected to a printed circuit board by means of a solder ball. FIG. 9 shows the semiconductor die, solder ball and printed circuit board inverted from the arrangement shown in FIG. 3, that is, in the same arrangement as FIG. 1.

Specifically, FIG. 9 shows a part of a semiconductor die 152 with a solder ball 154 and a printed circuit board 156.

The semiconductor die 152 comprises an Under Bump Metallurgy (UBM) layer 158, a PBO2 polymer layer 160, a redistribution layer (RDL) 162, and a PBO1 polymer layer 164, formed on the semiconductor (e.g. silicon) substrate 166 that includes the BEOL stack-up (not specifically shown in FIG. 9).

It will be appreciated that the semiconductor die 152 will typically be connected to the printed circuit board 156 by means of many such solder balls 154, and that such a structure of UBM layer, RDL and associated components will be provided under each of those solder balls.

It will be noted that the UBM layer 158 is formed with a substantially continuously flat lower surface 168 for coupling to the solder ball 154.

The three vias 136*f*, 136*d*, 136*e*, shown in FIG. 8(*c*), for example made of copper, are formed through the polymer layer 160, and connect the UBM layer 158 to the RDL 162.

As described previously, the structure illustrated in FIG. 9 has the advantage that it provides effective stress reduction, and hence improved life before failure caused by temperature cycling, and reduced stress in the Back End of Line (BEOL) portion of the device.

Therefore, in embodiments described above, an Under-Bump-Via (UBV) structure with vias drilled through a polymer layer has been provided to connect a UBM layer to an RDL.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure makes reference to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments likewise, with the benefit of this disclosure, will be apparent to those having ordinary skill in the art, and such embodiments should be deemed as being encompassed herein.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. A semiconductor die for coupling to a printed circuit board using a solder ball; the semiconductor die comprising:
    a redistribution layer formed above a semiconductor chip;
    a polymer layer formed on the redistribution layer, wherein the polymer layer comprises a plurality of vias;
    an Under Bump Metallurgy (UBM) layer formed on the polymer layer, wherein the plurality of vias are configured to electrically couple the solder ball to the redistribution layer via the UBM layer, and wherein the plurality of vias are positioned such that they are centered on a point not central to the UBM layer to reduce stress on the solder ball.

2. The semiconductor die as in claim 1, further comprising the solder ball.

* * * * *